(12) United States Patent
Cho et al.

(10) Patent No.: US 8,054,370 B2
(45) Date of Patent: Nov. 8, 2011

(54) WIRING SUBSTRATE, SOLID-STATE IMAGING APPARATUS USING THE SAME, AND MANUFACTURING METHOD THEREOF

(75) Inventors: Min-Kyo Cho, Seoul (KR); Jae-Cheon Doh, Chungcheongnam-do (KR); Young-Shin Kwon, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/650,610

(22) Filed: Dec. 31, 2009

(65) Prior Publication Data

US 2010/0102445 A1 Apr. 29, 2010

Related U.S. Application Data

(62) Division of application No. 11/053,209, filed on Feb. 7, 2005, now Pat. No. 7,659,936.

(30) Foreign Application Priority Data

Feb. 11, 2004 (KR) .................................. 2004-9029

(51) Int. Cl.
*H04N 5/225* (2006.01)

(52) U.S. Cl. ....................................................... 348/340
(58) Field of Classification Search ..................... 348/65, 348/340, 207.99
See application file for complete search history.

(56) References Cited

U.S. PATENT DOCUMENTS

| 4,594,613 A | * | 6/1986 | Shinbori et al. | ............ 348/340 |
| 5,040,069 A | * | 8/1991 | Matsumoto et al. | ............ 348/76 |
| 5,418,566 A | * | 5/1995 | Kameishi | ...................... 348/294 |

FOREIGN PATENT DOCUMENTS

| JP | 2001358997 | 12/2001 |
| JP | 2002246574 | 8/2002 |
| JP | 2003158252 | 5/2003 |
| JP | 2004-031932 | * 1/2004 |

* cited by examiner

*Primary Examiner* — Tuan Ho
(74) *Attorney, Agent, or Firm* — F. Chau & Associates, LLC

(57) ABSTRACT

In one embodiment, a miniaturized solid-state imaging apparatus includes a body having a cavity for mounting a semiconductor chip therein. The body has an overhanging portion extending toward the cavity. Further, a lead is disposed within the body. The lead has one end exposed through a top surface of the body and the other end exposed through a bottom surface of the body for electrical connection thereof.

2 Claims, 11 Drawing Sheets

WIRING SUBSTRATE, SOLID-STATE IMAGING APPARATUS USING THE SAME, AND MANUFACTURING METHOD THEREOF

CROSS-REFERENCE TO RELATED APPLICATION

This application is a divisional of U.S. application Ser. No. 11/053,209 filed on Feb. 7, 2005, now U.S. Pat. No. 7,659,936 which claims priority to Korean Patent Application No. 10-2004-0009029 filed in the Korean Intellectual Property Office on Feb. 11, 2004.

BACKGROUND OF THE INVENTION

1. Field of the Invention

The invention relates to a solid-state imaging apparatus, and more particularly, to a solid-state imaging apparatus in which a semiconductor chip has a first wiring substrate electrically coupled between a lens unit and a second wiring substrate.

2. Description of the Related Art

In general, mobile electronic devices, such as personal digital assistances (PDAs), digital still cameras (DSCs), or mobile phones, have a built-in solid-state imaging apparatus in which a semiconductor chip and a lens are combined. In a mobile phone equipped with a small digital camera, an image of a calling party is picked up by the camera and input to the mobile phone as image data, and the input image data may be transmitted to a called party.

As such mobile equipment has become smaller and smaller, demand for miniaturized solid-state imaging apparatuses used in such mobile equipment has increased. In order to meet such demand for miniaturized solid-state imaging apparatuses, development of semiconductor packages in which a lens and a semiconductor chip are incorporated is under way.

FIG. 1 is a schematic diagram of a conventional solid-state imaging apparatus 100. The conventional solid-state imaging apparatus 100 includes a lens mounting portion 150 to which a solid-state imaging lens 160 is attached, a flexible printed circuit board (FPC) 110 and a semiconductor chip 140.

Here, the lens mounting portion 150, to which the solid-state imaging lens 160 and an IR cut filter 165 are attached, is coupled to the top surface of the FPC 110 with an adhesive. The semiconductor chip 140 converts light from the solid-state imaging lens 160 into an image signal and to process the image signal. The semiconductor chip 140 is mounted on the FPC 110 and is coupled to pads formed on a predetermined region of the top surface of the FPC 110 by bonding wires 145.

Also, development of integrated semiconductor devices having a passive element 120, such as a resistor or capacitor, mounted in the solid-state imagine apparatus 100 is under way.

That is, the passive element 120 can be mounted on a predetermined region of the FPC 110. Referring to FIG. 1, the passive element 120 is mounted near a portion where the semiconductor chip 140 is adhered. In particular, the passive element 120 is mounted in the lens mounting portion 150 to form the integrated solid-state imagine apparatus 100.

When the passive element 120 is mounted within the solid-state imaging apparatus 100, Referring to FIG. 1, a horizontal length (L1) of the solid-state imaging apparatus 100 is increased, thereby impeding miniaturization of the solid-state imaging apparatus 100.

SUMMARY OF THE INVENTION

To solve the above-described problems, the invention provides a solid-state imaging apparatus which has a reduced horizontal length for miniaturization and a manufacturing method thereof.

Also, the invention provides a wiring substrate suitable for the solid-state imaging apparatus.

In one embodiment, a miniaturized solid-state imaging apparatus includes a body having a cavity for mounting a semiconductor chip therein. The body has an overhanging portion extending toward the cavity. Further, a lead is disposed within the body. The lead has one end exposed through a top surface of the body and the other end exposed through a bottom surface of the body for electrical connection thereof.

In an aspect of the invention, a solid-state imaging apparatus comprises a body having a cavity defining an area on which a semiconductor chip is mounted; a overhanging portion extending inward from an internal surface of the body toward the cavity; and a lead having one end coupled to the top surface of the body and the other end coupled to the bottom surface of the body.

In another aspect of the invention, a wiring substrate comprises a body having a cavity defining an area on which a semiconductor chip is mounted; an overhanging portion extending inward from an internal surface of the body toward the cavity; and a lead having one end extending inward from the overhanging portion of the body toward the cavity and the other end coupled to the bottom surface of the body.

In still another aspect of the invention, a solid-state imaging apparatus comprises a lens unit having a solid-state imaging lens; a first wiring substrate having a cavity; an overhanging portion having one end extending inward from an internal surface thereof toward the cavity and the other end coupled to the bottom surface of the lens unit such that the solid-state imaging lens and the cavity are opposite to and face each other; a second wiring substrate electrically coupled to the first wiring substrate; and a semiconductor chip adhered to a top surface of the second wiring substrate to be seated within the cavity and electrically coupled to the first wiring substrate.

BRIEF DESCRIPTION OF THE DRAWINGS

The above and other features and advantages of the invention will become more apparent by describing in detail preferred embodiments thereof with reference to the attached drawings.

DETAILED DESCRIPTION OF THE PREFERRED EMBODIMENTS

Advantages and features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this disclosure will be thorough and complete, and will fully convey the scope of various embodiments of the invention to those skilled in the art. The scope of the invention is defined only by the appended claims. Like numbers refer to like elements throughout this description and the drawings.

An embodiment of the invention will now be described with reference to FIGS. 2A through 4E.

Figure 2A:
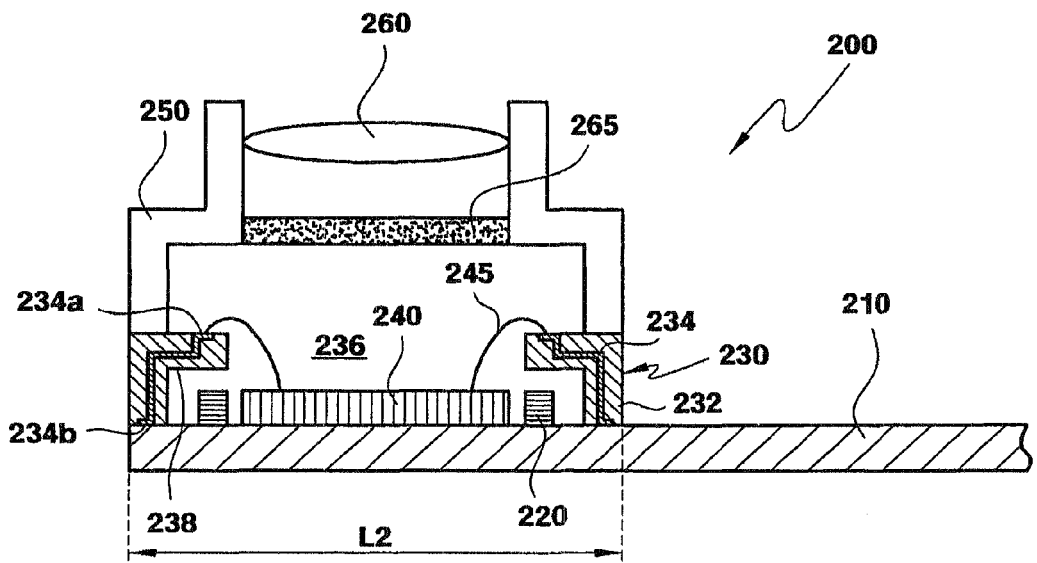
FIG. 2A is a cross-sectional view of a solid-state imaging apparatus according to a first embodiment of the invention.
Figure 2B:
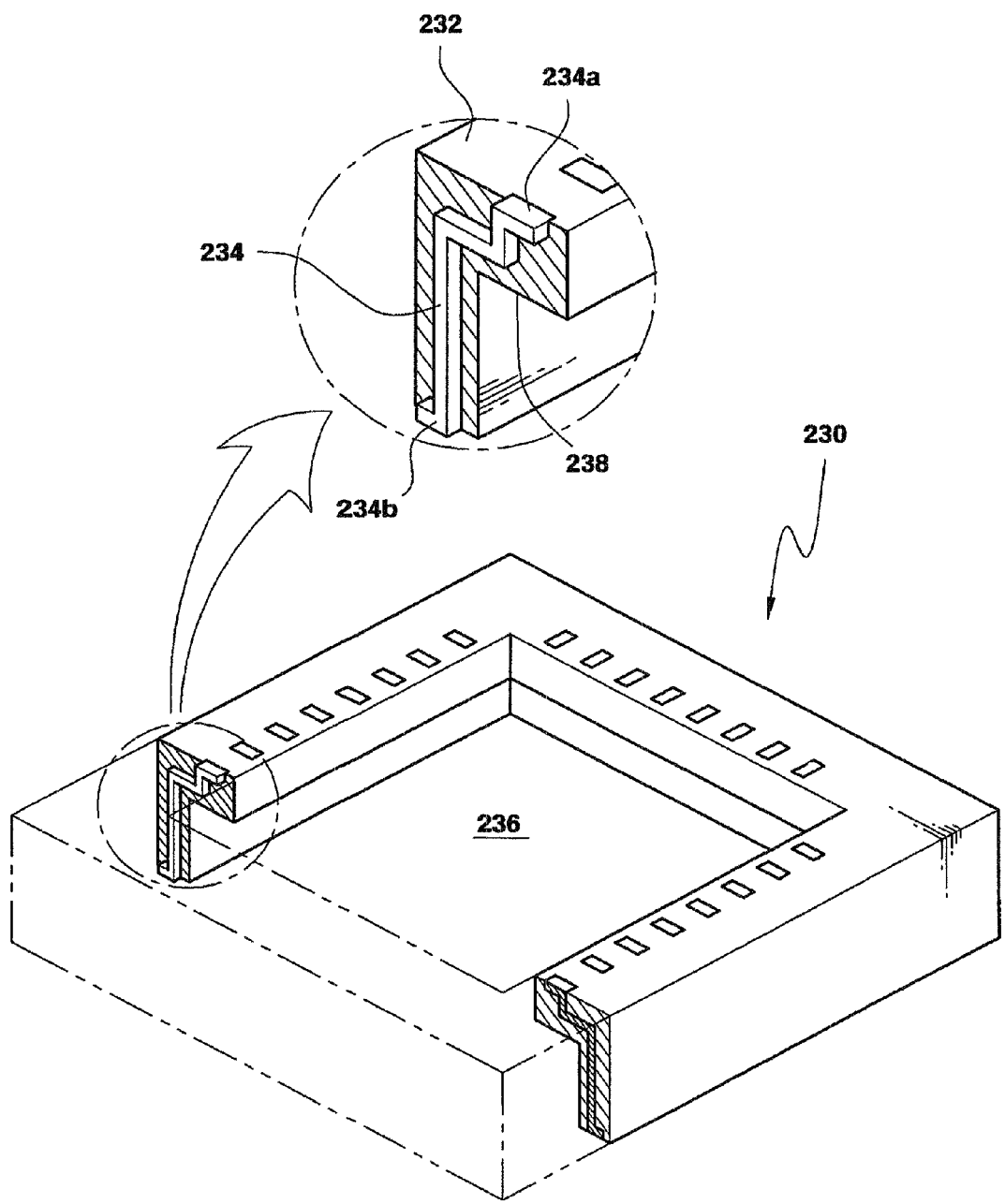
FIG. 2B is a partly exploded perspective view of a first wiring substrate shown in FIG. 2A.

FIG. 2A is a cross-sectional view of a solid-state imaging apparatus 200 and FIG. 2B is a partly exploded perspective view of a first wiring substrate 230 shown in FIG. 2A.

Referring to FIGS. 2A and 2B, the solid-state imaging apparatus 200 includes a lens unit 250, a first wiring substrate 230, a second wiring substrate 210, and a semiconductor chip 240. The lens unit 250 has a solid-state imaging lens 260 attached thereto.

The lens unit 250 has a light receiving hole 252 formed at a portion through which light passes. To the light receiving hole 252 is attached the solid-state imaging lens 260. Preferably, an IR cut filter 265 or a high frequency cut filter is installed at a portion through which the light has passed. For the sake of convenience, the invention will be described in conjunction with an IR cut filter by way of example.

The first wiring substrate 230 includes a body 232 and a lead 234. The body 232 may be coupled to the bottom of the lens unit 250 by an adhesive (not shown). The body 232 includes a cavity 236 disposed below the solid-state imaging lens 260. The cavity 236 defines an area for mounting a semiconductor chip 240 in the body 232. Referring to FIG. 2B, a overhanging portion 238 having an upper portion extending inward with respect to the cavity 236 is formed in the body 232. Because the bottom of the first wiring substrate 230 is coupled to the upper surface of the second wiring substrate 210, a predetermined space is formed between the overhanging portion 238 and the second wiring substrate 210. Therefore, a passive element 220 can be mounted in the predetermined space between the overhanging portion 238 and the second wiring substrate 210. A resistor, a capacitor, or an inductor may be used as the passive element 220.

On the other hand, the lead 234 can be formed within the body 232. One end 234a of the lead 234 is exposed through the top surface of the body 232, and the other end 234b of the lead 234 is exposed through the bottom surface of the body 232. Examples of typical materials of the lead 234 include Cu and an alloy of Ni and Fe. The lead 234 may be an etching type, in which a base panel is etched away except a predetermined portion thereof, or a stamping type, in which a base panel is pressed into a predetermined pattern using a mold. The lead 234 may be preferably plated with a noble metal such as Ni or Au.

Examples of the first wiring substrate 230, including the body 232 and the lead 234, include, but not limited to, PCB, ceramic leadless chip carrier (CLCC), pre-molded leadless chip carrier (PLCC), and the like. The PLCC is made of an epoxy molding compound (EMC), for example. However, one skilled in the art will appreciate that the above-stated examples of the first wiring substrate 230 are provided for illustration only and the present invention is not limited thereto.

The second wiring substrate 210 is electrically coupled to the first wiring substrate 230. Thus, the semiconductor chip 240, electrical connection means, e.g., a bonding wire 245, the first wiring substrate 230, and the second wiring substrate 210 are electrically coupled to one another, and the solid-state imaging device 200 and external body (not shown) are electrically coupled through the second wiring substrate 210. In the illustrative embodiment of the invention, FPC can be used as the second wiring substrate 210.

Referring to FIGS. 2A and 2B, the semiconductor chip 240 is bonded to the second wiring substrate 210 so that it is seated within the cavity 236 of the body 232. An electrode pad (not shown) formed on the top surface of the semiconductor chip 240 and the one end 234a of the lead 234 are electrically coupled to each other by electrical connection means 245. In the illustrative embodiment of the invention, the electrical connection mean 245 may be a bonding wire. However, other electrical connection means can be used within the spirit and the scope of the present invention.

The semiconductor chip 240 may be a single semiconductor chip in which a solid-state imaging device and an image processing device are incorporated.

The solid-state imaging device preferably includes a group of photoelectric conversion elements for converting light from the solid-state imaging lens 260 into an image signal, by methods and elements familiar to those skilled in the art. For example, the solid-state imaging device includes a photoelectric conversion unit (sensor), a driving circuit, an audio-to-digital (A/D) converting unit, a signal processing unit, and a semiconductor circuit. The photoelectric conversion unit preferably has a group of photoelectric conversion elements arranged in a two-dimensional matrix, forming a CMOS image sensor (CIS) unit. The driving circuit unit sequentially drives the photoelectric conversion elements to obtain signal charges. The A/D converting unit converts the signal charges into digital signals. The signal processing unit processes the digital signals to output image signals. The semiconductor circuit has an exposure controller formed on the same semiconductor chip, the exposure controller electrically controlling the exposure time based on the output level of the digital signal. The semiconductor chip may include a charged coupled device (CCD).

The image processing chip processes an image signal output from the semiconductor chip.

The semiconductor chip 240 forms an image of an object on a sensor of the semiconductor chip 240 through the solid-state imaging lens 260 and the IR cut filter 265, and photoelectrically converts the object image and outputs the converted image as an image signal in either a digital or analog form. Then the semiconductor chip 240 processes the image signal and outputs the same to the lead 234.

The sensor of the semiconductor chip 240 is disposed below the solid-state imaging lens 260.

Figure 1:
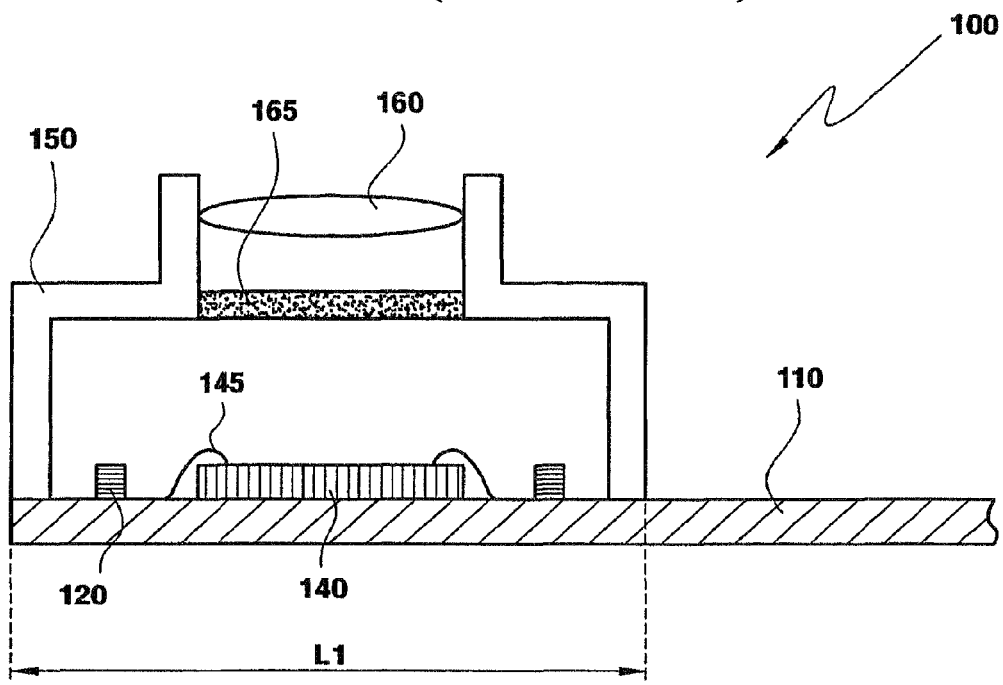
FIG. 1 is a cross-sectional diagram schematically showing a conventional solid-state imaging apparatus.

As described above, the semiconductor chip 240 and the second wiring substrate 210 are electrically coupled to each other through the first wiring substrate 230 having the overhanging portion 238, rather than being directly coupled to each other as in the prior art. Thus, compared to the conventional solid-state imaging apparatus shown in FIG. 1, there is no change in the height of the solid-state imaging apparatus 200. However, since the passive element 220 is mounted in a predetermined space between the overhanging portion 238 of the first wiring substrate 230 and the second wiring substrate 210, and it is not necessary to form a pad for electrical connection with the semiconductor chip 240 on the second wiring substrate 210, the solid-state imaging apparatus 200 having a reduced horizontal length (L2) can be realized.

A manufacturing method of the solid-state imaging apparatus 200 shown in FIG. 2A will now be explained with reference to FIGS. 3A through 3D and FIGS. 4A through 4E.

FIGS. 3A through 3D are cross-sectional views illustrating a method of manufacturing the solid-state imaging apparatus 200 shown in FIG. 2A. FIGS. 4A through 4E are plan views of FIGS. 3A through 3D and FIG. 2A, respectively.

Figure 3A:
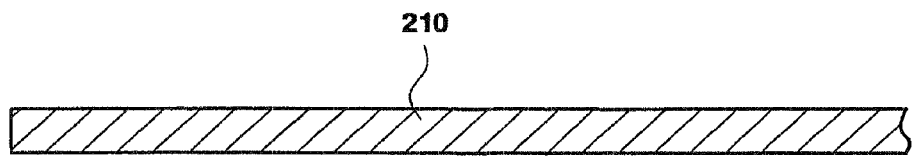
FIGS. 3A through 3D are cross-sectional views illustrating a method of manufacturing a solid-state imaging semiconductor apparatus shown in FIG. 2A.
Figure 3B:
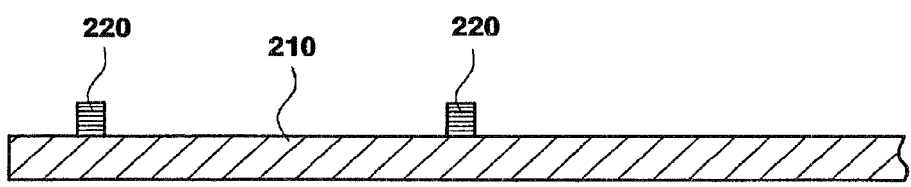
Figure 4A:
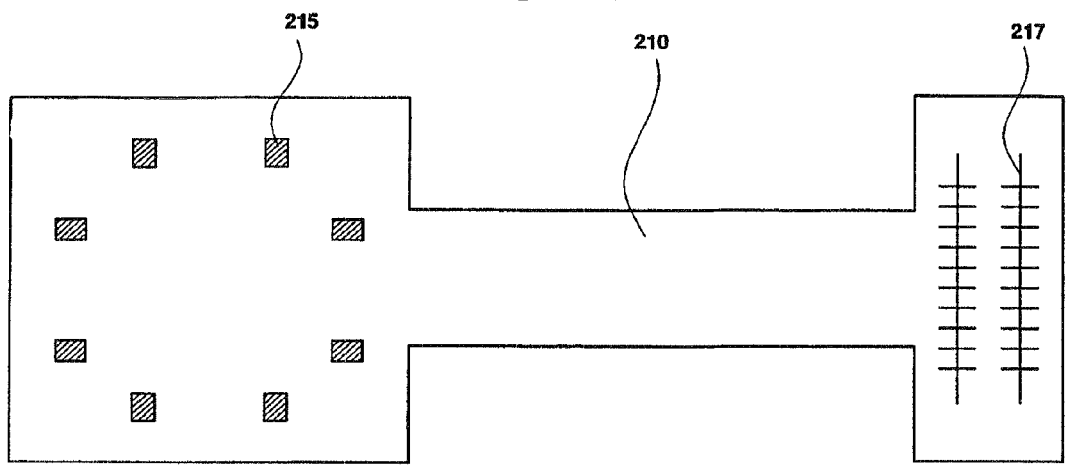
FIGS. 4A through 4E are plan views of FIGS. 3A through 3D and FIG. 2A, respectively.

Referring to FIGS. 3A and 4A, the second wiring substrate 210 connects the solid-state imaging apparatus 200 with an external system (not shown). Bonding pads 215 are formed on the second wiring substrate 210. The second wiring substrate 210 comprises a connection terminal 217 electrically coupled to the external system, and bonding pads 215 defining an area on which the passive element 220 is mounted (FIG. 4B).

Figure 4B:
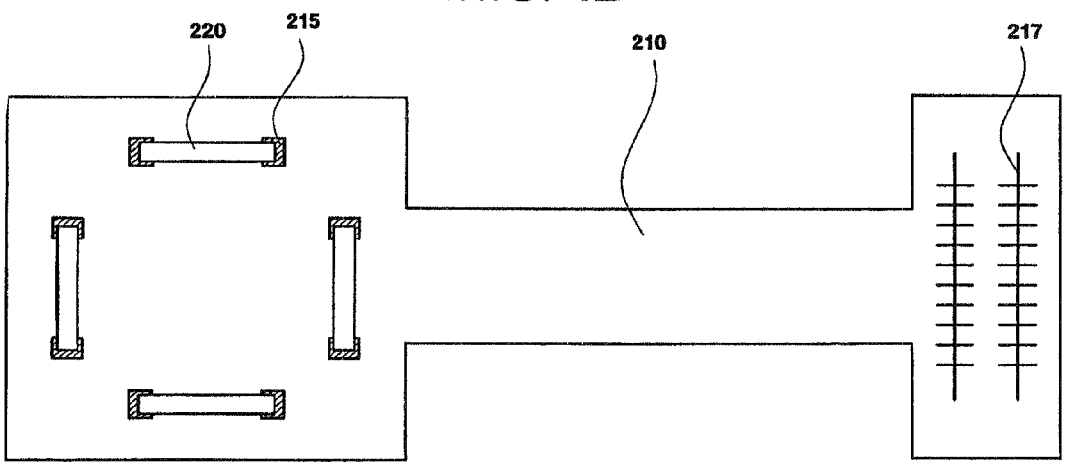

Referring to FIGS. 3A and 4B, the passive element 220 is mounted on the second wiring substrate 210. The passive element 220 is preferably arranged near an area where the semiconductor chip 240 is mounted, which will later be described later. Generally, the passive element 220 is arranged on the second wiring substrate 210 by a surface mount technology (SMT).

Figure 3C:
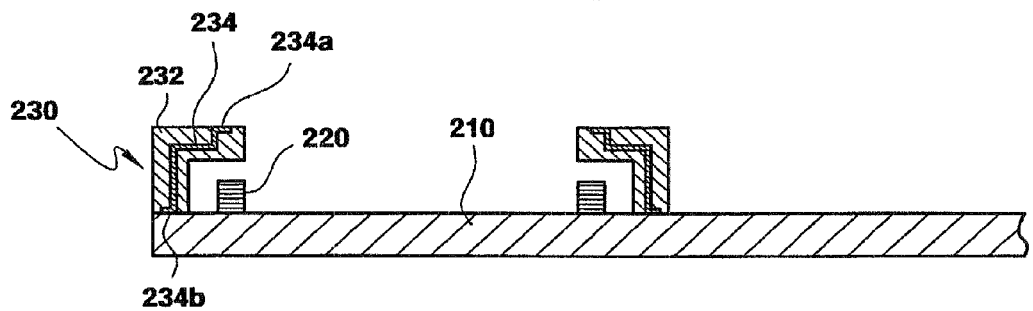
Figure 4C:
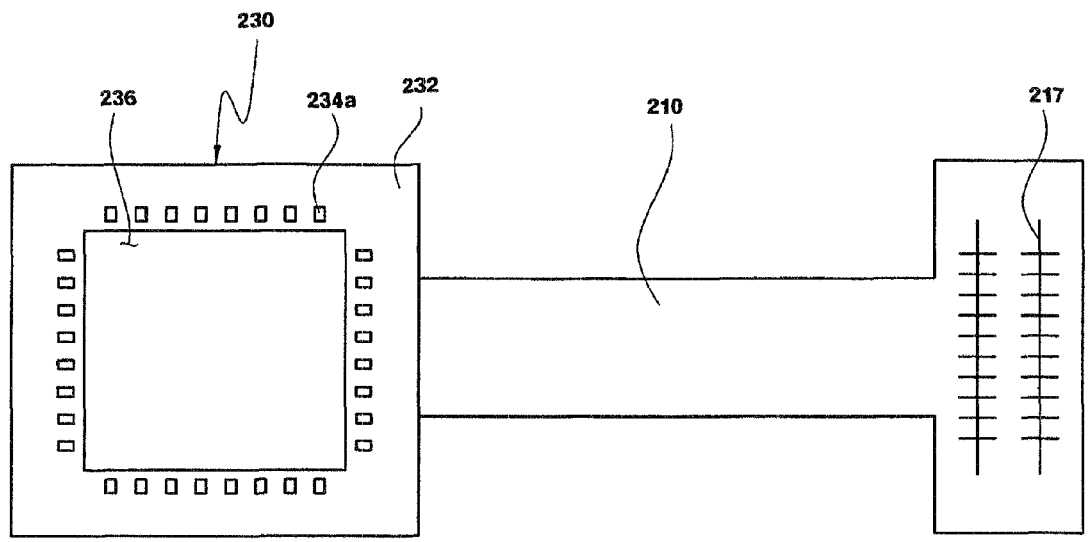

Referring to FIGS. 3C and 4C, the first wiring substrate 230 having the overhanging portion 238 is mounted on the second wiring substrate 210. The passive element 220 is positioned under the overhanging portion 238.

Figure 3D:
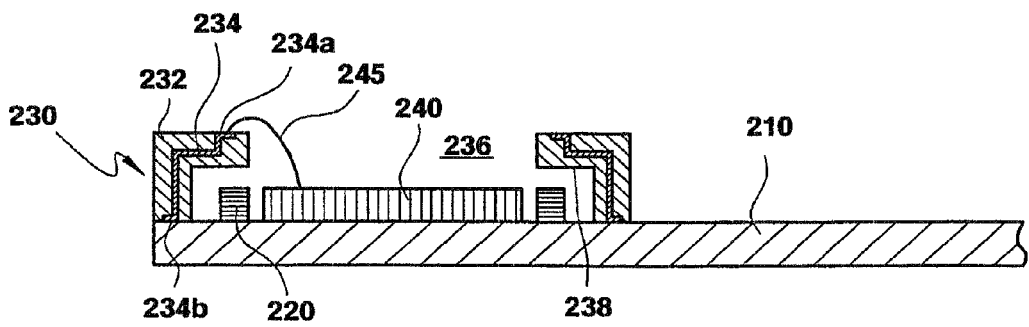
Figure 4D:
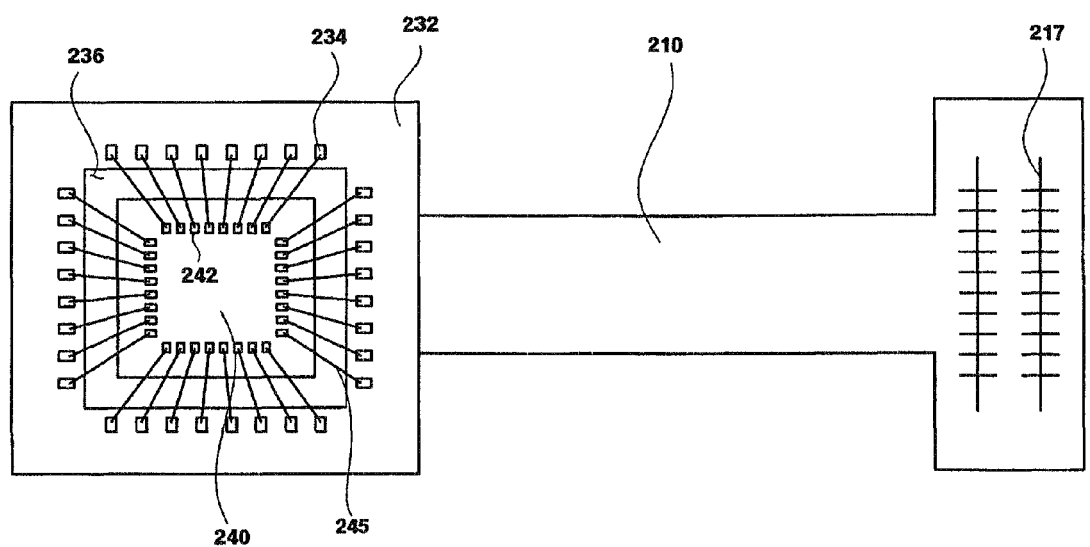

Referring to FIGS. 3D and 4D, the semiconductor chip 240 is mounted on the second wiring substrate 210, using conventional techniques and materials, so that it is seated within the cavity 236 of the first wiring substrate 230.

Figure 4E:
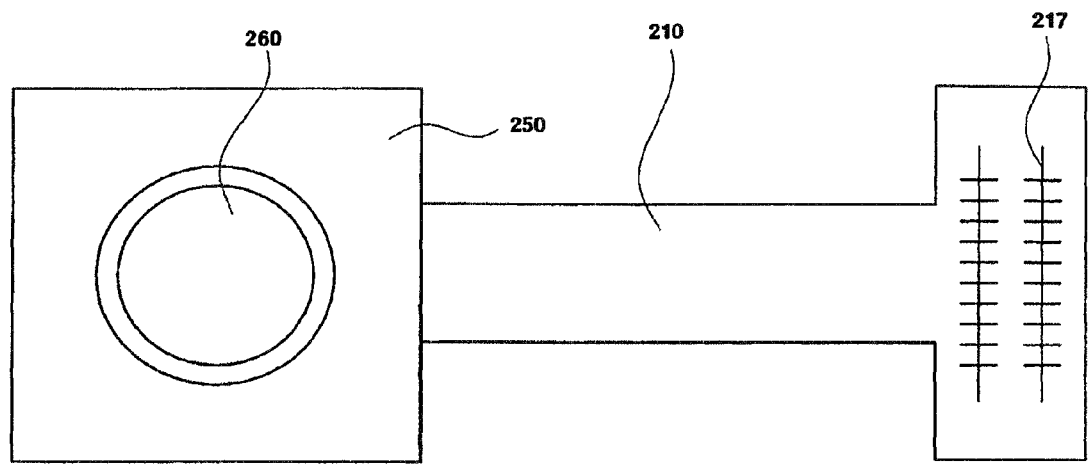

Referring to FIGS. 2A and 4E, the lens unit 250 includes the solid-state imaging lens 260 and the IR cut filter 265. The lens unit 250 is coupled to the upper portion of the first wiring substrate 230 using conventional techniques. Then, bond pads 242 formed on the semiconductor chip 240 are electrically connected to the one end 234a of the lead 234 via electrical connection means, for example, the bond wire 245.

Another embodiment of the invention will now be described with reference to FIG. 5, in which elements the same as or corresponding to those of the previous embodiment shown in FIGS. 2A through 4E are denoted by the same reference numerals and an explanation thereof will not be given for simplicity.

Figure 5:
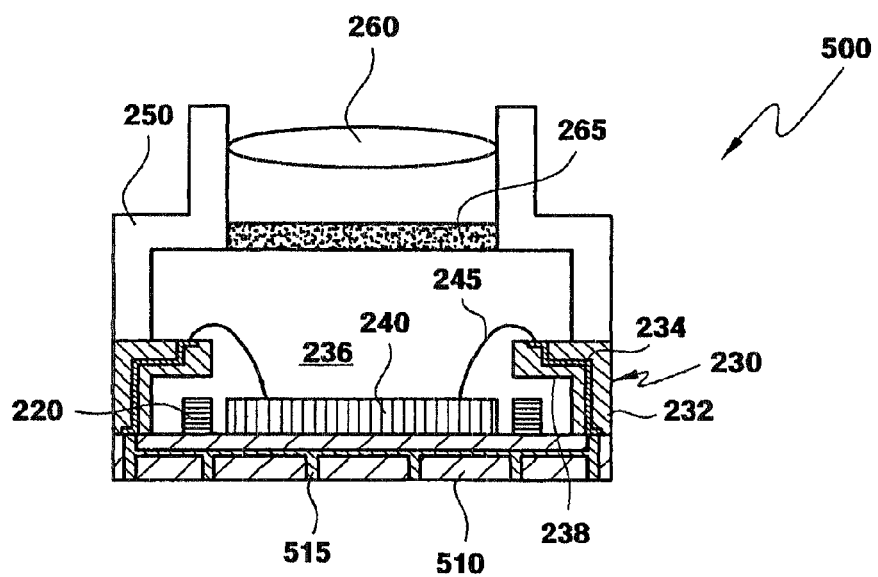
FIG. 5 is a cross-sectional view of a solid-state imaging apparatus according to a second embodiment of the invention.

FIG. 5 is a cross-sectional view of a solid-state imaging apparatus 500 according to another embodiment of the invention.

Referring to FIG. 5, the solid-state imaging apparatus 500 is different from the solid-state imaging apparatus 200 according to the previous embodiment in that a second wiring substrate 510 used is of a socket type. The socket-type second wiring substrate 510 used in this embodiment has an external connection terminal 515 formed at the back side or lower portion of the second wiring substrate 510.

Still another embodiment of the invention will now be described with reference to FIG. 6, in which elements the same as or corresponding to those of the previous embodiment shown in FIGS. 2A through 4E are denoted by the same reference numerals and an explanation thereof will not be given.

Figure 6:
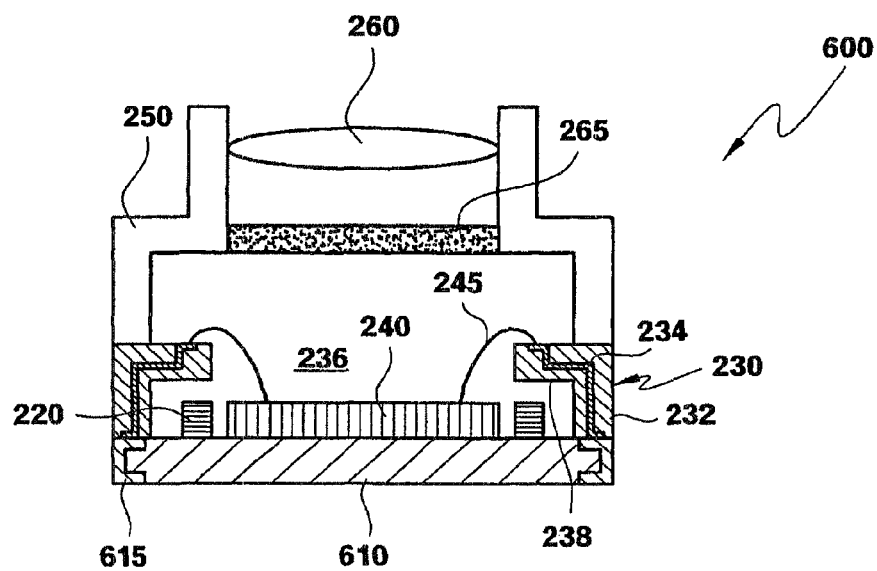
FIG. 6 is a cross-sectional view of a solid-state imaging apparatus according to a third embodiment of the invention.

FIG. 6 is a cross-sectional view of a solid-state imaging apparatus 600 according to still another embodiment of the invention.

Referring to FIG. 6, the solid-state imaging apparatus 600 is different from the solid-state imaging apparatus 200 in that a second wiring substrate 610 used is of a socket type. The socket-type second wiring substrate 610 has an external connection terminal 615 formed on a lateral surface of the second wiring substrate 610.

Yet another embodiment of the invention will now be described with reference to FIG. 7, in which elements the same as or corresponding to those of the previous embodiment shown in FIGS. 2A through 4E are denoted by the same reference numerals and an explanation thereof will not be given.

Figure 7:
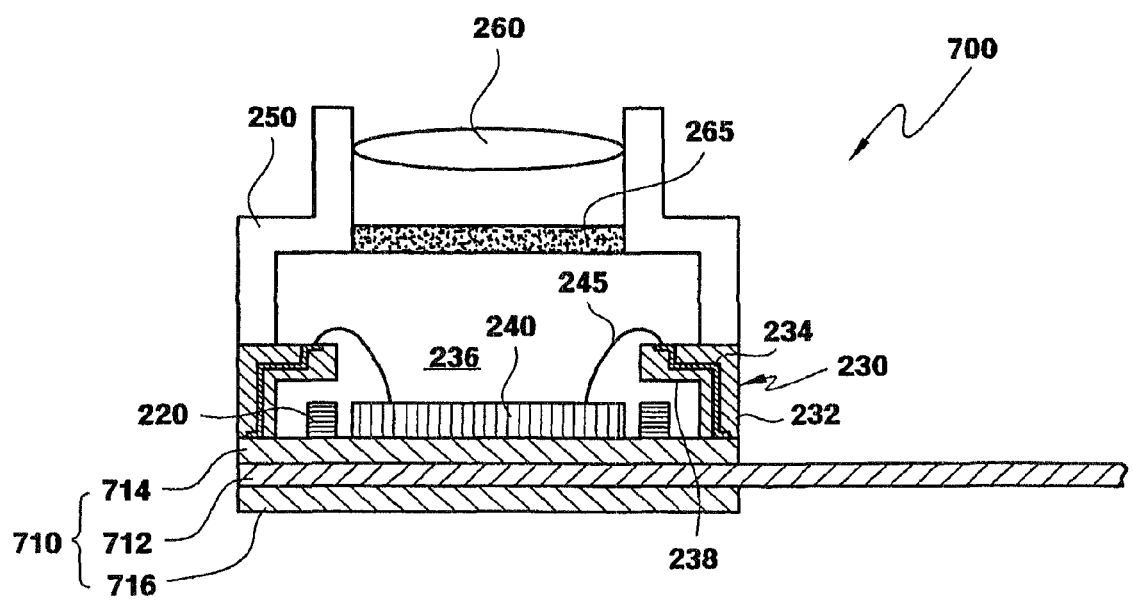
FIG. 7 is a cross-sectional view of a solid-state imaging apparatus according to a fourth embodiment of the invention.

Referring to FIG. 7, the illustrative embodiment is different from the first-described embodiment in that a Rigid-Flexible PCB (RF-PCB) is used as a second wiring substrate 710. The RF-PCB 710 is a printed circuit substrate having a multilayered, rigid PCB 714, which is generally used in the art, and a flexible PCB 712 combined therein, enabling three-dimensional circuit connection, thereby realizing highly functional, miniaturized portable electronic devices. There is no limitation in numbers of the rigid PCB 714, 716, and the flexible PCB 712 used.

Still another embodiment of the invention will now be described with reference to FIGS. 8A and 8B, in which elements the same as or corresponding to those of the first-described embodiment shown in FIGS. 2A through 4E are denoted by the same reference numerals and an explanation thereof will not be given.

Figure 8A:
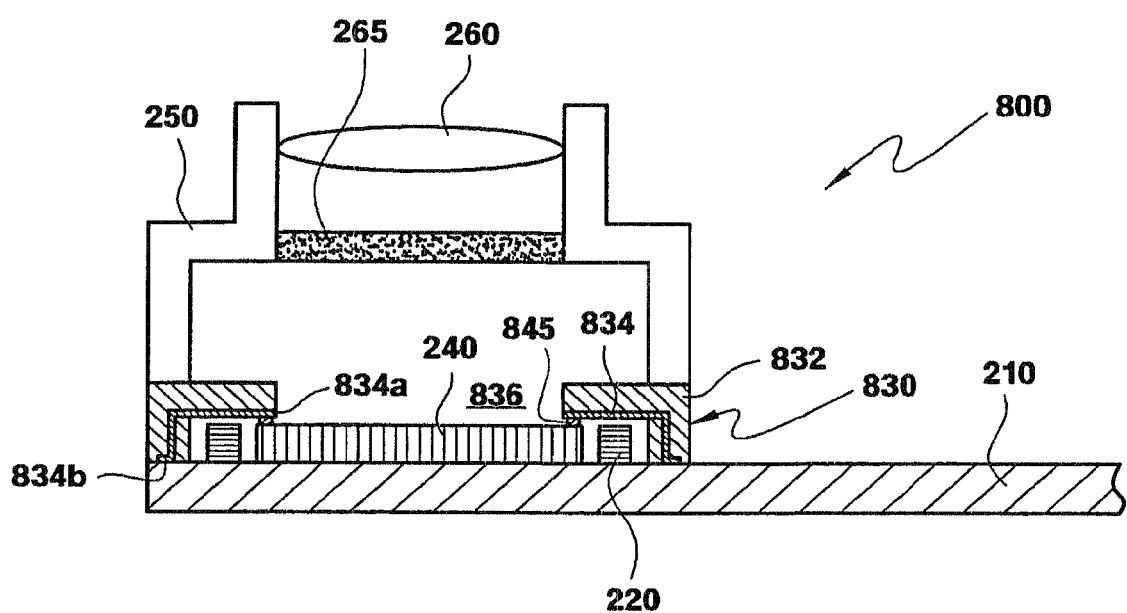
FIG. 8A is a cross-sectional view of a solid-state imaging apparatus according to a fifth embodiment of the invention.
Figure 8B:
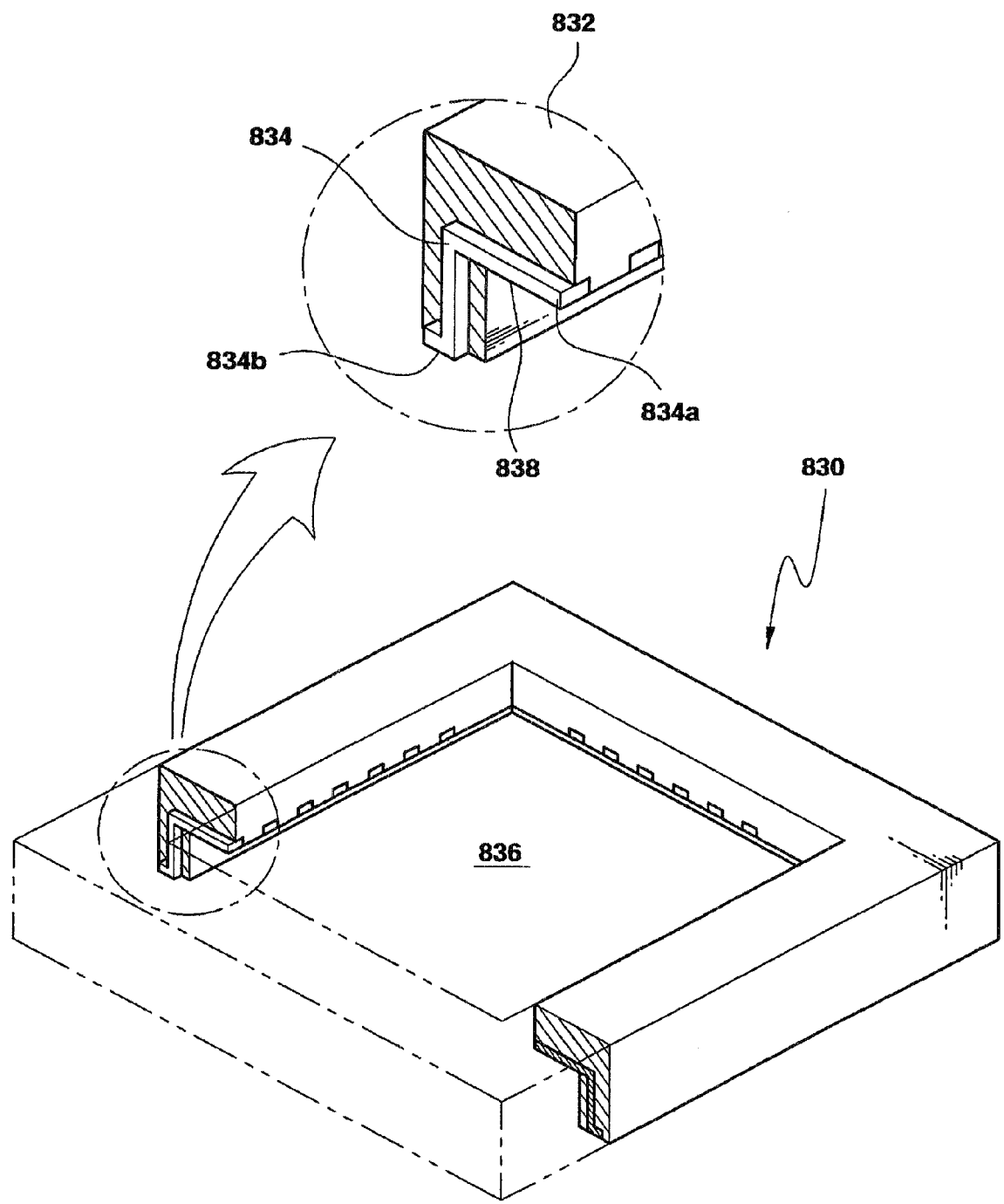
FIG. 8B is a partly exploded perspective view of a first wiring substrate shown in FIG. 8A.

FIG. 8A is a cross-sectional view of a solid-state imaging apparatus 800 according to this embodiment of the invention, and FIG. 8B is a partly exploded perspective view of a first wiring substrate 830 shown in FIG. 8A.

As shown FIG. 8A, the solid-state imaging apparatus 800 of the invention comprises a lens unit 205 to which the solid-state imaging lens 260 is attached, the first wiring substrate 830, a second wiring substrate 210, and a semiconductor chip 240. The solid-state imaging apparatus 800 according to the illustrative embodiment is different from the solid-state imaging apparatus 200 according to the first-described embodiment in that the structure of the first wiring substrate 830 is changed, and electrical connection means 845 connecting the semiconductor chip 240 to the first wiring substrate 830 is a flip-chip bonding pad, instead of the bonding wire.

Referring to FIG. 8A and FIG. 8B, the first wiring substrate 830 includes a body 832 and a lead 834. The body 832 is coupled to the lower portion of the lens unit 250, for example, by an adhesive. The body 832 has a cavity 836 disposed under the solid-state imaging lens 260. The cavity 236 is an area where the semiconductor 240 is mounted.

Referring to FIG. 8B, the body 832 includes an overhanging portion 838 extending inward toward the cavity 836. Because the bottom of the first wiring substrate 830 and the second wiring substrate 210 are coupled, a predetermined space is formed between the overhanging portion 838 of the first wiring substrate 830 and the second wiring substrate 210. Therefore, a passive element 220 can be mounted in the predetermined space between the overhanging portion 838 of the first wiring substrate 830 and the second wiring substrate 210. The lead 834 is formed within the body 832. One end 834a of the lead 834 extends toward the cavity 836, and the other end 834b of the lead 834 is exposed through the bottom surface of the body 832. The lead 834 may include Cu and an alloy of Ni and Fe. The lead 834 may be an etching type, in which a base panel is etched away except a predetermined portion thereof, and a stamping type, in which a base panel is pressed into a predetermined pattern using a mold. The lead 834 is preferably plated with a noble metal such as Ni or Au.

The first wiring substrate 830, including the body 832 and the lead 834, may include, but is not limited to, PCB, CLCC, PLCC, and the like. The PLCC is made of an epoxy molding compound (EMC), for example. However, the above-stated examples of the first wiring substrate 830 are provided for illustration only.

Referring to FIGS. 8A and 8B, the semiconductor chip 240 is bonded to the second wiring substrate 210 so that it is seated within the cavity 836 of the body 832. An electrode pad (not shown) formed on the top surface of the semiconductor chip 240 and the one end 834a of the lead 834 are electrically coupled to each other by electrical connection means 845. In the illustrative embodiment of the invention, the electrical connection mean 845 is preferably a conductive for flip chip bonding.

Still another embodiment of the invention will now be described with reference to FIG. 9, in which elements the same as or corresponding to those of the embodiment shown in FIGS. 8A through 8B are denoted by the same reference numerals and an explanation thereof will not be given.

Figure 9:
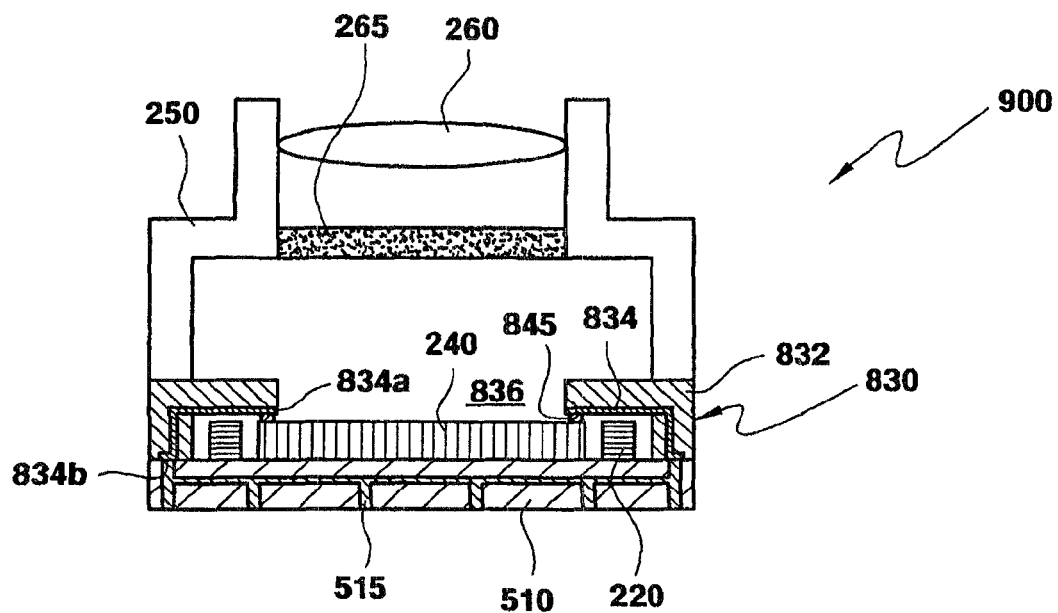
FIG. 9 is a cross-sectional view of a solid-state imaging apparatus according to a sixth embodiment of the invention.

FIG. 9 is a cross-sectional view of a solid-state imaging apparatus 900 according to still another embodiment of the invention.

Referring to FIG. 9, the solid-state imaging apparatus 900 according to the illustrative embodiment is different from the solid-state imaging apparatus 800 according to the last-described embodiment in that a second wiring substrate 510 is of a socket type. The socket-type second wiring substrate 510 has an external connection terminal 515 formed at the back side or lower portion of the second wiring substrate 510.

Still another embodiment of the invention will now be described with reference to FIG. 10, in which elements the same as or corresponding to those of the embodiment shown in FIGS. 8A and 8B are denoted by the same reference numerals and an explanation thereof will not be given.

Figure 10:
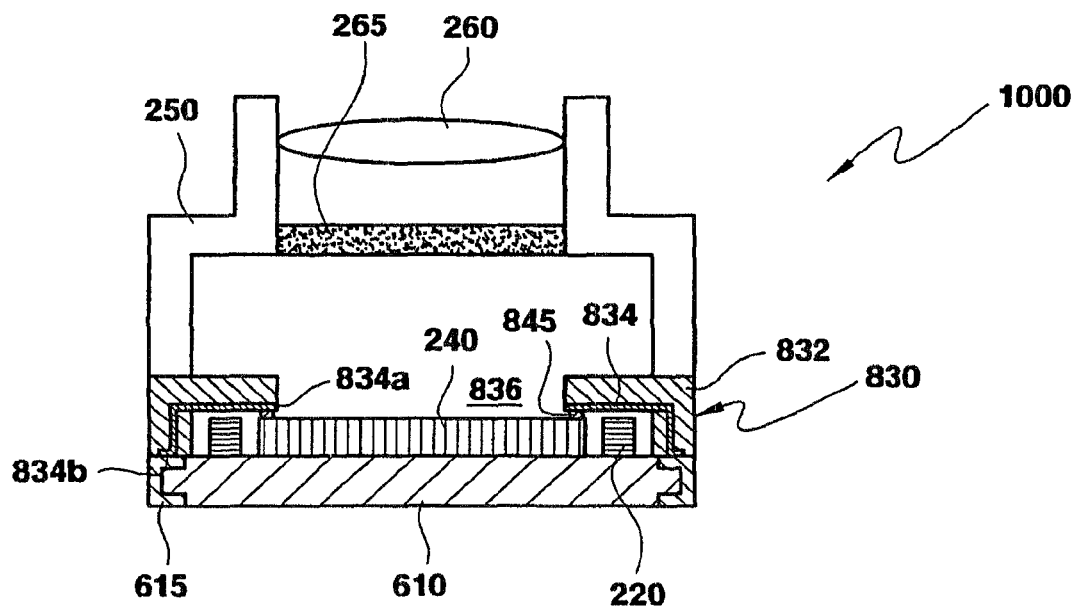
FIG. 10 is a cross-sectional view of a solid-state imaging apparatus according to a seventh embodiment of the invention.

Referring to FIG. 10, the solid-state imaging apparatus 1000 according to the illustrative embodiment is different from the solid-state imaging apparatus 800 according to the embodiment shown in FIGS. 8A and 8B in that a second wiring substrate 610 is of a socket type. The socket-type second wiring substrate 610 has an external connection terminal 615 formed on a lateral surface thereof.

Yet another embodiment of the invention will now be described with reference to FIG. 11, in which elements the same as or corresponding to those of the embodiment shown in FIGS. 8A and 8B are denoted by the same reference numerals and an explanation thereof will not be given.

Figure 11:
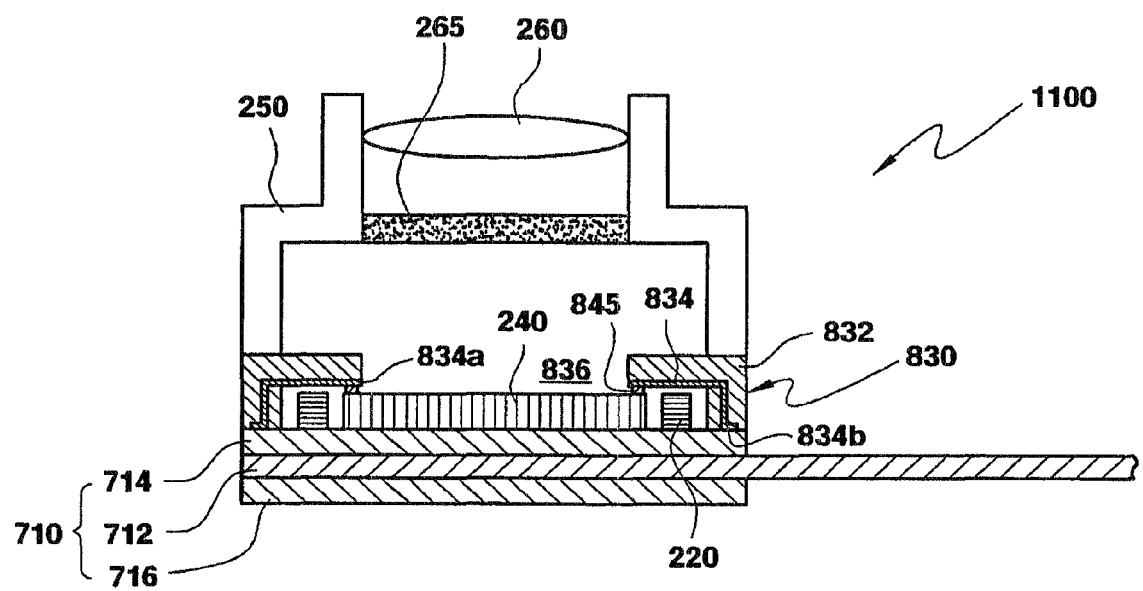
FIG. 11 is a cross-sectional view of a solid-state imaging apparatus according to an eighth embodiment of the invention.

FIG. 11 is a cross-sectional view of a solid-state imaging apparatus 1100 according to this embodiment of the invention.

Referring to FIG. 11, the solid-state imaging apparatus 1100 is different from the solid-state imaging apparatus 800 in that a rigid-flexible PCB (RF-PCB) is used as a second wiring substrate 710. The RF-PCB 710 is a combined printed circuit substrate having a multilayered, rigid PCB 714, 716, which is generally used in the art, and a flexible PCB 712 combined therein, enabling three-dimensional circuit connection, thereby realizing highly functional, miniaturized portable electronic devices. Here, there is no limitation in numbers of the rigid PCB 714, 716, and the flexible PCB 712 used.

While the invention has been particularly shown and described with respect to illustrative embodiments thereof, it will be understood by those skilled in the art that the foregoing and other changes in form and details may be made therein without departing from the spirit and scope of the invention which should be limited only by the scope of the appended claims. Thus, preferred embodiments of the invention disclosed above are used in a generic and descriptive sense only and not for purposes of limitation.

As described above, in the solid-state imaging apparatus according to the invention, rather than directly connecting of a semiconductor chip with a second wiring substrate, the semiconductor chip and the second wiring substrate are electrically coupled by means of a first wiring substrate having an overhanging portion. Passive elements can be mounted in a predetermined space between the overhanging portion of the first wiring substrate and the second wiring substrate. Also, it is not necessary to form a pad on the second wiring substrate for the purpose of electrically connecting with the semiconductor chip, which reduces a horizontal length of the apparatus, thereby achieving a miniaturized solid-state imaging apparatus.

What is claimed is:

1. A wiring substrate comprising:
   a body having a cavity for mounting a semiconductor chip therein, the body having an overhanging portion extending toward the cavity; and
   a lead disposed within the body, the lead having:
      one end exposed through a top surface of the overhanging portion, the top surface being at an end of the cavity distal from the semiconductor chip mountable in the cavity, and
      the other end exposed through a bottom surface of the body for electrical connection thereof.

2. The wiring substrate of claim 1, wherein the semiconductor chip is electrically coupled to the one end of the lead.

\* \* \* \* \*